United States Patent
Safiri

(10) Patent No.: US 8,446,935 B2
(45) Date of Patent: May 21, 2013

(54) METHOD AND CIRCUIT FOR FRACTIONAL RATE PULSE SHAPING

(75) Inventor: Hamid Safiri, Plano, TX (US)

(73) Assignee: Icera, Inc., Wilmington, DE (US)

(*) Notice: Subject to any disclaimer, the term of this patent is extended or adjusted under 35 U.S.C. 154(b) by 186 days.

(21) Appl. No.: 13/062,611

(22) PCT Filed: Sep. 8, 2009

(86) PCT No.: PCT/CA2009/001240
§ 371 (c)(1),
(2), (4) Date: Mar. 7, 2011

(87) PCT Pub. No.: WO2010/025564
PCT Pub. Date: Mar. 11, 2010

(65) Prior Publication Data
US 2011/0164663 A1  Jul. 7, 2011

Related U.S. Application Data

(60) Provisional application No. 61/094,680, filed on Sep. 5, 2008.

(51) Int. Cl.
*H04B 1/38* (2006.01)
(52) U.S. Cl.
USPC .......... 375/219; 375/220; 375/224; 375/225; 375/259; 375/295; 375/296; 375/316; 375/350; 455/39; 455/63.1; 455/67.13; 455/73; 455/91; 455/114.3; 455/130; 370/272; 370/273; 370/276; 370/297; 341/61
(58) Field of Classification Search
USPC .............. 375/219, 220, 224, 225, 259, 295, 375/296, 316, 350; 455/39, 63.1, 67.13, 73, 455/91, 114.3, 130; 370/272, 273, 276, 297; 341/61
See application file for complete search history.

(56) References Cited

U.S. PATENT DOCUMENTS

| | | | |
|---|---|---|---|
| 5,621,404 A | 4/1997 | Heiss et al. | |
| 7,098,821 B2 | 8/2006 | Husted et al. | |
| 7,236,110 B2 * | 6/2007 | Antonesei | 341/61 |
| 7,248,189 B2 | 7/2007 | Sinha et al. | |
| 2007/0080834 A1 | 4/2007 | Auld et al. | |

FOREIGN PATENT DOCUMENTS

| | | |
|---|---|---|
| WO | 2006053156 A1 | 5/2006 |
| WO | 2010025564 A1 | 3/2010 |

OTHER PUBLICATIONS

GB Office Action, Application No. GB1105184.4, Sep. 3, 2012, 3 pages.
Foreign Communication From a Related Counterpart Application, Great Britain Application 1105184.4, Great Britain Office Action dated Mar. 8, 2013, 3 pages.

* cited by examiner

*Primary Examiner* — Leon Flores

(57) ABSTRACT

A method and system for fractionally converting sample rates. Fractional rate conversion for a transmit path of a transceiver is achieved by upsampling an input signal having a first sample rate by a first integer factor, removing aliasing resulting from the upconversion process, and then downsampling the intermediate signal by a second integer factor to provide a final signal having a second sample rate. The first factor and the second factor are selected to obtain a desired output sample rate that is a fraction of the sample rate of the input signal.

10 Claims, 6 Drawing Sheets

METHOD AND CIRCUIT FOR FRACTIONAL RATE PULSE SHAPING

CROSS-REFERENCE TO RELATED APPLICATION

This application is the National Stage of, and therefore claims the benefit of, International Application No. PCT/CA2009/001240 filed on Sep. 8, 2009, entitled "A METHOD AND CIRCUIT FOR FRACTIONAL RATE PULSE SHAPING," which was published in English under International Publication Number WO 2010/025564 on Mar. 11, 2010, and has a priority date of Sep. 5, 2008, based on U.S. Provisional Application Ser. No. 61/094,680. Each of the above applications is commonly assigned with this National Stage application and is incorporated herein by reference in their entirety.

FIELD OF THE INVENTION

The present invention relates generally to wireless transceivers. More particularly, the present invention relates to sample rate conversion in the transmit path of a wireless transceiver.

BACKGROUND OF THE INVENTION

Wireless devices have been in use for many years for enabling mobile communication of voice and data. Such devices can include mobile phones and wireless enabled personal digital assistants (PDA's) for example. FIG. 1 is a generic block diagram of the core components of such wireless devices. The wireless core 10 includes a base band processor 12 for controlling application specific functions of the wireless device and for providing and receiving voice or data signals to a radio frequency (RF) transceiver chip 14. The RF transceiver chip 14 is responsible for frequency up-conversion of transmission signals, and frequency down-conversion of received signals. RF transceiver chip 14 includes a receiver core 16 connected to an antenna 18 for receiving transmitted signals from a base station or another mobile device, and a transmitter core 20 for transmitting signals through the antenna 18. Those of skill in the art should understand that FIG. 1 is a simplified block diagram, and can include other functional blocks that may be necessary to enable proper operation or functionality.

Generally, the transmitter core 20 is responsible for up-converting electromagnetic signals from base band to higher frequencies for transmission, while receiver core 16 is responsible for down-converting those high frequencies back to their original frequency band when they reach the receiver, processes known as up-conversion and down-conversion (or modulation and demodulation) respectively. The original (or base band) signal, may be, for example, data, voice or video. These base band signals may be produced by transducers such as microphones or video cameras, be computer generated, or transferred from an electronic storage device. In general, the high frequencies provide longer range and higher capacity channels than base band signals, and because high frequency radio frequency (RF) signals can propagate through the air, they are preferably used for wireless transmissions.

All of these signals are generally referred to as radio frequency (RF) signals, which are electromagnetic signals; that is, waveforms with electrical and magnetic properties within the electromagnetic spectrum normally associated with radio wave propagation.

In a typical radio of a wireless device, the radio operates at a specific bandwidth (BW) in MHz or chip rate in Msamples/s (Ms/s), and the wireless transceiver upconverts an output signal from the radio to another frequency for wireless transmission. For example in a 3G radio, where 3G is well known wireless communication standard, the BW is 3.84 MHz and the chip rate (also known as sample rate) is 3.84 Ms/s. In the example wireless device of FIG. 1, the output of base band processor 12 is provided at 3.84 Ms/s. Ideally, the transmitter core 20 operates with frequencies that are harmonics of 3.84 MHz, which persons of skill in the art would understand are straightforward to implement. In this example, an ideal clock in the chip would run at 38.4 MHz, which can be easily divided by 10 to yield 3.84 MHz.

Currently, an interface standard has been established for governing signal communication between a base band processor and the RF transceiver, called DigRF. DigRF is a digital interface standard defined and supported by the Mobile Industry Processor Interface (MIPI) Alliance, and should be well known to those of skill in the art. Under the DigRF standard, the base band processor creates the digital versions of I and Q data signals and sends them to the RF transceiver. The RF transceiver then performs digital-to-analog conversion to create the analog signals that become the radio signal to be transmitted. In the DigRF standard, transactions with the interface are conducted at a preset frequency of 312 MHz, or a sample rate of 312 Ms/s. Unfortunately, 312 MHz is not a harmonic of the 3.84 MHz chip rate from the base band processor. In otherwords, 3.84 MHz is not an integer multiple of 312 MHz.

This is problematic given that one of the requirements in DigRF 3G is to perform uplink RRC (root raised cosine) pulse shaping. For example, an input to the RRC pulse shaper should be running at the WCDMA chip rate of 3.84 Ms/s, while its output should be generating samples at a sample rate compatible with a digital to analog converter (DAC) of the transmit path of the RF transceiver. However, a suitable sample rate for a downstream DAC may not be a multiple 3.84 Ms/s.

One solution is to design the RF transceiver to generate a different clock that is some multiple of 3.84 MHz, however clock generation is relatively expensive to implement. Furthermore, on chip generated clock harmonics may fall in or out of the band spectrum.

It is, therefore, desirable to provide a system and method for sample rate conversion between frequencies that are not harmonics of each other.

SUMMARY OF THE INVENTION

It is an object of the present invention to obviate or mitigate at least one disadvantage of previous sample rate converters.

In a first aspect, the present invention provides a fractional rate converting filter. The converting filter includes a delay line, a multiplier circuit, an adder circuit and a selector. The delay line receives a digital input signal at a first sample rate, and provides outputs. The multiplier circuit receives the outputs and multiplies the outputs by corresponding filter tap coefficients, where each filter tap coefficient is spaced by a first integer Y, the integer Y corresponding to an upconversion factor. The multiplier circuit providing tap outputs corresponding to each of the outputs. The adder circuit receives and sums the tap outputs to provide an output signal. The selector iteratively shifts the filter tap coefficients corresponding to each output by a second integer Z in each clock cycle for a predetermined number of clock cycles, where the integer Z corresponds to a downconversion factor. The output signal has a second sample rate equivalent to the first sample rate multiplied by Y and divided by Z.

In a current embodiment, the delay line includes delay blocks each providing one of the outputs, the delay blocks being inhibited from receiving another digital input signal during the predetermined number of clock cycles. The multiplier circuit includes individual multipliers each configured to receive one of the respective outputs. The selector includes multiplexor circuits receiving different subsets of filter tap coefficients for application to each of the individual multipliers at the same time. Each of the subsets has the filter tap coefficients spaced by the first integer Y, and each of the different subsets has the filter tap coefficients shifted by the second integer Z relative to a previous subset of the filter tap coefficients. The converting filter further includes a tap controller for controlling each of the multiplexor circuits to provide one of the different subsets during one of predetermined number of clock cycles.

In another embodiment, the multiplier circuit and the adder circuit are part of a multiplier/accumulator (MAC). In this embodiment, the selector includes a tap selector configured to receive all the filter tap coefficients and to provide a subset of the filter tap coefficients in one clock cycle, and a delay selector configured to receive the outputs and to provide the outputs in the one clock cycle synchronously with the filter tap coefficients of the subset. Each of the filter tap coefficients is spaced by the first integer Y. A tap controller is further included for controlling the tap selector to output different subsets of filter tap coefficients, where each subset has the filter tap coefficients shifted by the integer Z relative to a previous subset.

In further aspect, the present invention provides a method for fractionally converting a first sample rate to a second sample rate. The method includes upsampling a digital input signal having the first sample rate by an integer factor of Y to generate an upsampled digital input signal having undesired images; filtering out the undesired images from the upsampled digital input signal to provide a filtered upsampled digital input signal; and downsampling the filtered upsampled digital input signal by an integer factor of Z to generate a final digital input signal having the second sample rate. According to one embodiment, the step of filtering is executed with a frequency corresponding to a downstream digital to analog converter sample rate, where the frequency is an integer multiple of a predetermined frequency provided by an interface that provides the digital input signal.

In another embodiment, filtering includes controlling an FIR filter to provide sample outputs using different subsets of taps. Furthermore, the method can include receiving the digital input signal in a delay line having outputs, and upsampling can include multiplying a subset of filter tap coefficients with the outputs, the filter tap coefficients being spaced apart by Y. In yet another embodiment, downsampling includes multiplying the outputs with different subsets of filter tap coefficients, where each of the subsets have filter tap coefficients shifted by Z relative to a previous subset of filter tap coefficients. Downsampling further includes providing each of the subsets in each clock cycle of a predetermined number of clock cycles. In the present embodiment, the delay line includes delay blocks each providing one of the outputs, the delay blocks being inhibited from receiving another digital input signal during the predetermined number of clock cycles. The delay blocks can be enabled to receive a new digital input signal after the predetermined number of clock cycles.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a method and system for fractionally converting sample rates. Fractional rate conversion for a transmit path of a transceiver is achieved by upsampling an input signal having a first sample rate by a first integer factor, removing aliasing resulting from the upconversion process, and then downsampling the intermediate signal by a second integer factor to provide a final signal having a second sample rate. The first factor and the second factor are selected to obtain a desired output sample rate that is a fraction of the sample rate of the input signal.

Figure 1:
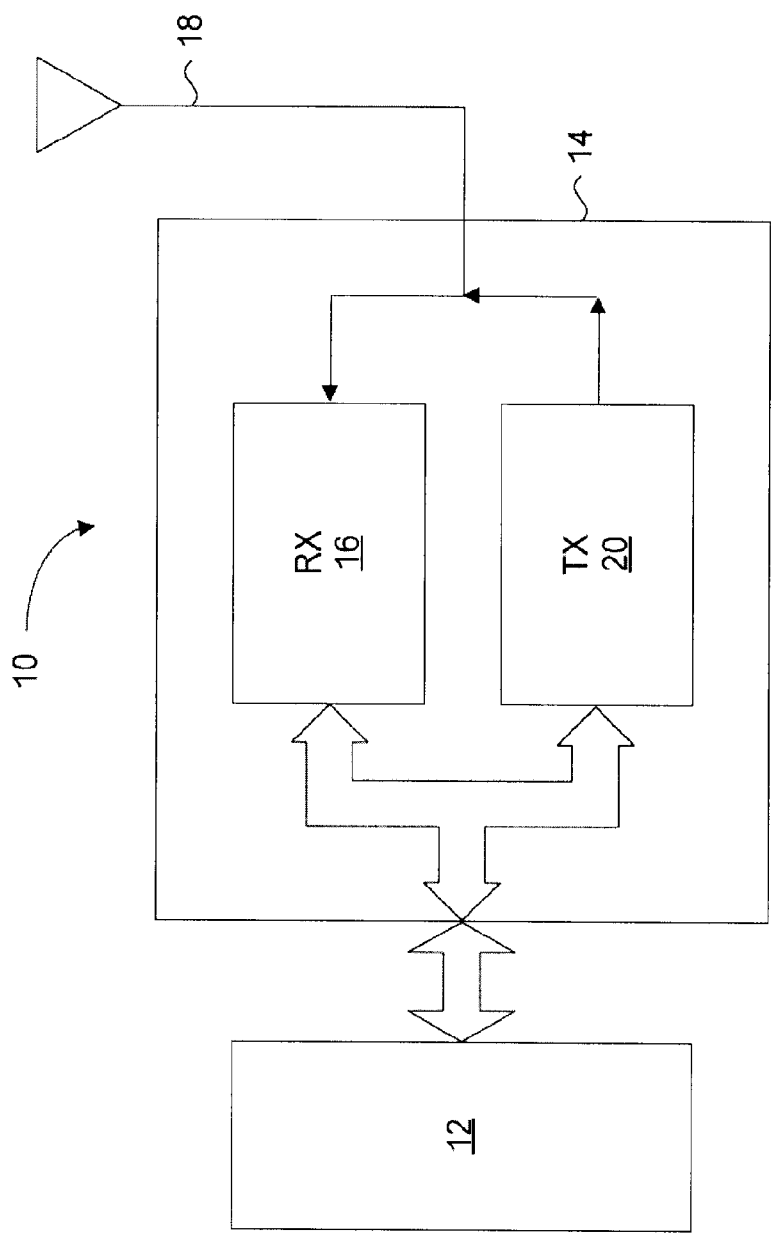
FIG. 1 is a block diagram of a wireless device of the prior art.
Figure 2:
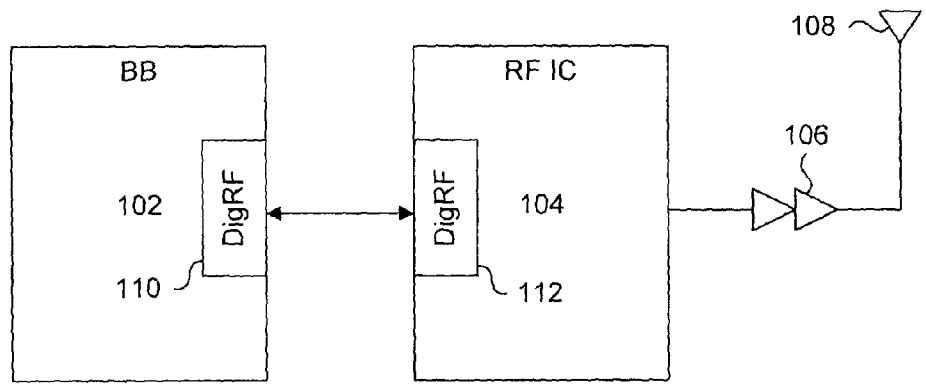
FIG. 2 is a block diagram illustrating a wireless device having a DigRF interface.

FIG. 2 is general block diagram illustrating a wireless device having a DigRF interface. Wireless device 100 is shown to include a base band processor 102, an RF transceiver 104, a power amplifier 106 and an antenna 108. Both the base band processor 102 and the RF transceiver 104 have a DigRF interface 110 and 112 respectively, which meet the physical connection requirements and signal protocol requirements established by the DigRF standard. RF transceiver 104 includes both transmit core circuits and receive core circuits coupled to the antenna 108. Therefore a base band processor 102 from any manufacturer will be able to communicate properly with any RF transceiver 104 from any other manufacturer.

As previously noted, a requirement of the DigRF 3G standard is to perform uplink RRC (root raised cosine) pulse shaping. This pulse shaping can be executed in the RF transceiver 104, and in particular, in the DigRF interface 112 of the RF transceiver 104. According to the present embodiments, the pulse shaping circuit receives input data having a first sample rate (Ms/s), which is converted to a second sample rate that is a non-integer factor of the first sample rate. In otherwords, the second sample rate is a fractional rate of the first sample rate. No additional clock generation is required in RF transceiver 104. The signal converted to the second sample rate is then provided to the circuits of the transmit path, to be processed for wireless transmission via power amplifier 106 and antenna 108.

Figure 3:
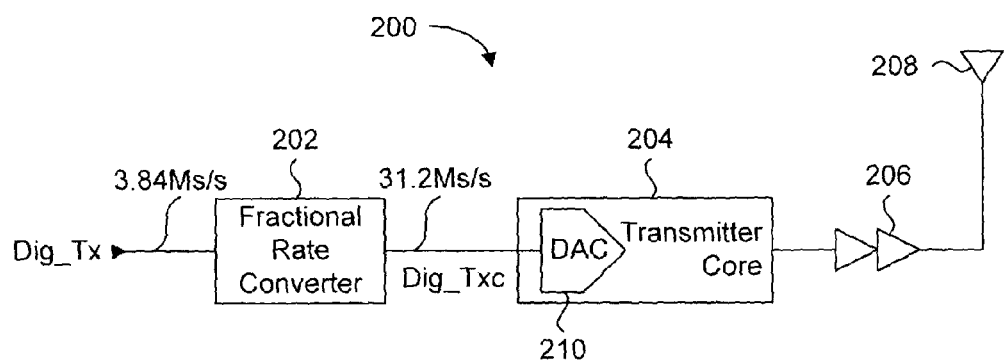
FIG. 3 shows circuit blocks of a transmit path of the RF transceiver of FIG. 2, according to a present embodiment.

FIG. 3 is a block diagram illustrating an embodiment of the present invention. More specifically, FIG. 3 shows circuit blocks of a transmit path of RF transceiver 104 of FIG. 2 which process a digital transmit signal received from DigRF interface 112. The transmit path 200 includes a pulse shaping fractional rate converter 202, a transmitter core 204, power amplifier 206 and antenna 208. Transmitter core 204 can include any known transmit circuits configured for any wireless communication standard. By example, such standards can include CDMA, GSM and EDGE. Because the DigRF interface receives and provides transmit data in digital format, the transmitter core 204 is shown to include a digital to analog converter (DAC) 210 for converting the digital signals into analog signals. Those skilled in the art will understand that other signal processing circuits can be included between DAC 210 and the input of transmitter core 204, depending on the application requirements.

In an example of the present embodiment, it is assumed that the digital data Dig_Tx is received from the DigRF interface 112 at a sample rate of 3.84 Ms/s. For the 3G wireless communication standard, a suitable sample rate for DAC 210 can be 31.2 Ms/s. Therefore, because the DigRF interface has a 312 MHz clock, a 31.2 Ms/s sample rate can be obtained simply by dividing the 312 MHz DigRF clock by 10 and configured to have a 50% duty cycle. Therefore no additional clock generation is required in the transmit path circuits. Accordingly, fractional rate converter 202 applies a conversion factor of 8.125 to the sample rate of Dig_Tx to provide converted digital data Dig_Txc having the sample rate of 31.2 Ms/s. This non-integer conversion factor can be equivalently obtained by dividing the integer value of 65 by the integer value of 8 (65/8). As will be shown later, this principle is used to achieve non-integer conversion factors, such as 8.125 in the present example.

Figure 4:
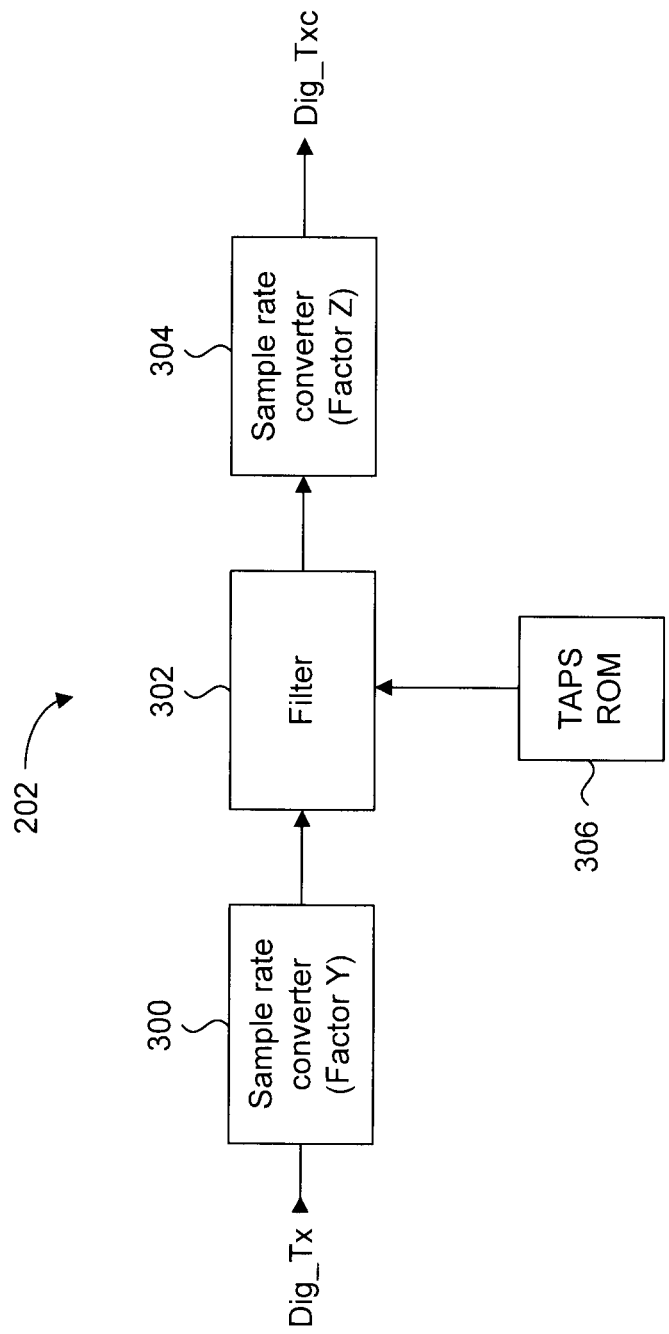
FIG. 4 is a schematic showing details of the fractional rate converter of FIG. 3, according to a present embodiment.

FIG. 4 is a block diagram showing a conceptual organization of the fractional rate converter 202 of FIG. 3, according to a present embodiment. The fractional rate converter includes a first sample rate converter 300, a filter 302, a second sample rate converter 304 and a memory 306 for storing coefficient data for the taps of filter 302. In one embodiment, the first sample rate converter 300 is an upsampler while the second sample rate converter 304 is a downsampler. In a second alternative embodiment, the first sample rate converter 300 is a downsampler while the second sample rate converter 304 is a upsampler. The upsampling/downsampling factor applied by first sample rate converter 300 is referred to as an integer factor Y, while the upsampling/downsampling factor applied by second sample rate converter 304 is referred to as an integer factor Z. In the first embodiment, the input digital data Dig_Tx has a input sample rate expressed as SR_A which is upsampled by integer factor Y by first sample rate converter 300. The resulting intermediate upsampled version of Dig_Tx is provided to filter 302 for removing aliasing/imaging effects resulting from the upsampling process. The intermediate upsampled version of Dig_Tx now has a sample rate of SR_A multiplied by Y, which is then provided to second sample rate converter 304 for downsampling by integer factor Z. The final sample rate of Dig_Txc can then be expressed as SR_B=SR_A*Y/Z. Using the numerical example discussed for FIG. 3, if SR_A=3.84 Ms/s, Y=65 and Z=8, then SR_B=3.84*65/8=31.2. Digital circuits for upsampling and downsampling are known in the art and straightforward to implement for integer upsampling/downsampling factors.

Depending on the application and performance requirements, post processing circuits can be added to enhance the Dig_Txc signal. In the present example, the first image of the 31.2 Ms/s signal will be attenuated sufficiently by using a 5th order filter. Such techniques are well known in the art, and are not discussed as they are not relevant to the embodiments of the present invention.

As previously mentioned, the upsampling provided by first sample rate converter 300 produces aliasing and images which are undesired. In the present embodiment, filter 302 can be a pulse shaping digital finite input response (FIR) filter configured to have a number of taps, where the taps have coefficients set for the desired filter response. FIR filters are well known in the art. Accordingly, filter 302 removes the unwanted images from the desired signal, prior to downconversion by second sample rate converter 304. In wireless system design, a parameter to note is the well known error vector magnitude (EVM), which is an indicator of the performance of the system. The EVM contribution by the fractional rate converter 202 to the total EVM of the system is preferably minimized, since other components, such as those upstream from fractional rate converter 202, may have a larger contribution to the total system EVM. According to a present embodiment, EVM of the fractional rate converter 202 is minimized through dynamic tap adjustment and clocking of the filter 302.

In the presently described example, where the signal Dig_Tx is upsampled by a factor of 65, a 651 tap FIR filter is used with an 11 chip footprint. The FIR filter is designed in a poly-phase structure, and since the output is subsequently down-sampled by a factor of 8, only every 8th output sample is calculated. According to the present embodiment, the FIR filter taps to use are shifted by 8 positions every time a new output sample is generated. Every time taps are wrapped around a new input sample is read out from a first-in-first-out (FIFO) register of the DigRF interface. In otherwords, different subsets of taps are used for generating the outputs of FIR filter 302. In the present example, every subset of taps includes taps which are positioned by a distance of 65 taps away from each other. These operations are executed with a 31.2 MHz clock, which as previously explained is easily derived from the DigRF 312 MHz clock. This operation will require an input sample every 8 clocks for seven times consecutive inputs followed by one input sample after 9 clocks. This provides 3.84 Ms/s on average. Accordingly, FIR filter 302 is referred to in the present embodiments as a dynamic tap adjustable filter.

Figure 5:
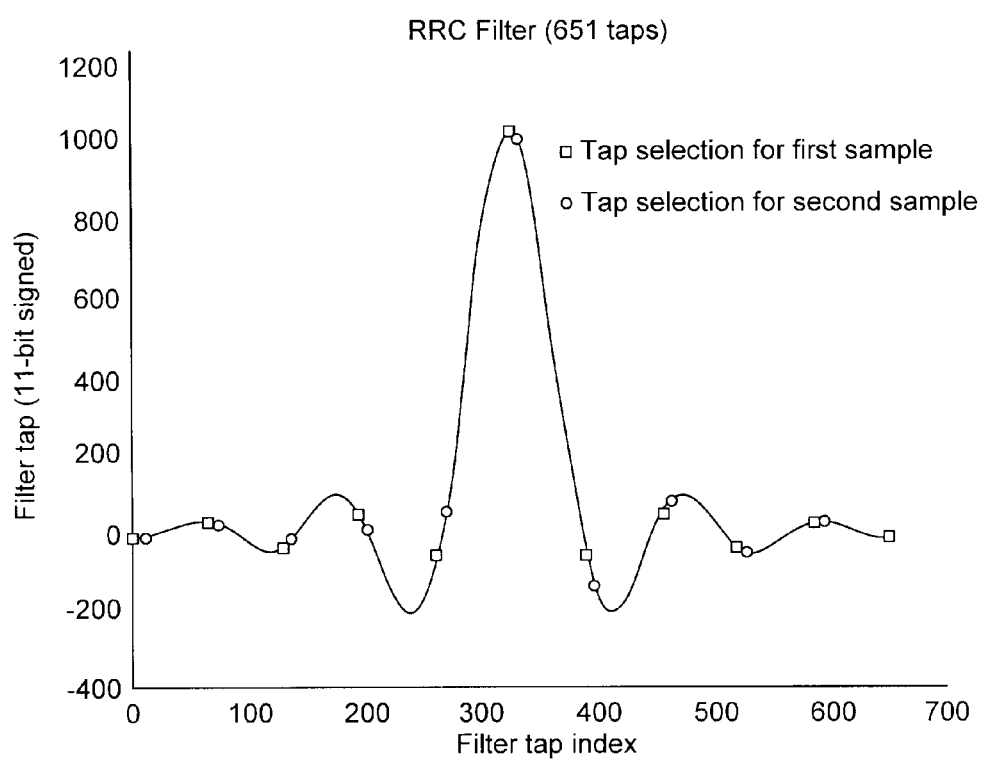
FIG. 5 a graphical plot of a desired filter response for the dynamic tap adjustable filter of FIG. 4, according to a present embodiment.

FIG. 5 is a plot of the desired filter response for the dynamic tap adjustable filter 302 having the design parameters listed above, where the vertical axis represents the tap value and the horizontal axis represents the tap index of the FIR filter. This plot is used by example to explain the dynamic tap adjustment feature of the present embodiment. It is assumed that a first output sample is generated using a first subset of the 651 taps marked by the squares in the plot of FIG. 5. This first subset uses taps h0, h65, h130, h195 and so forth until the last tap of h650. A second output is generated using a second subset of the 651 taps marked by the circles in the plot of FIG. 5. This second subset uses taps h8, h73, h138, h203 and so forth, until the last tap of h593. This second subset is referred to as a shifted subset of taps, which in the present example where downconversion by 8 is desired, is a shifting of 8. Eventually, the last output before a new input sample is read out of the DigRF FIFO, is calculated using a subset taps h64, h129, h194 and so forth until last tap h649. When the RRC taps wrap around, a new sample is generated by using a subset of taps including h7, h72, h137 and so forth until last tap h592. The shifting of taps then continues for the current sample until the wrap around condition occurs again, at which time another new input sample is read out and new subsets with shifted taps are used.

Figure 6:
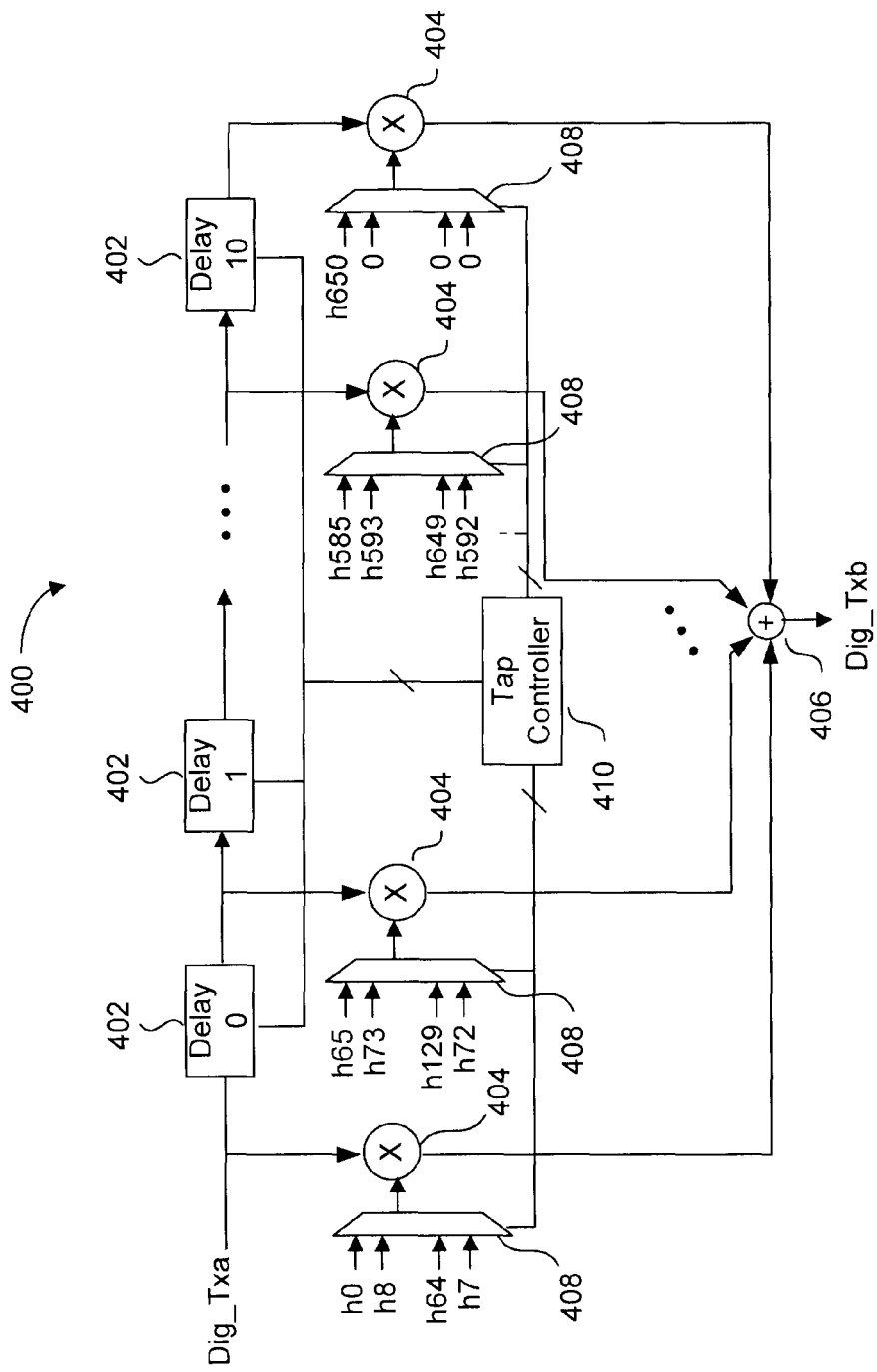
FIG. 6 is a block diagram of the fractional rate converter of FIG. 4, according to a present embodiment.

FIG. 6 is a block diagram of a fractional rate converting filter 400 according to a present embodiment, where filter 400 can be used as FIR filter 302 and rate converters 300 and 304 of FIG. 4. The fractional rate converting filter 400 has dynamically adjustable taps, and includes well known components such as a delay line including delay blocks 402, multipliers 404 and an adder 406, where each multiplier receives a different coefficient (h0 to h650 by example) to multiply against the outputs of the delay line. Collectively, the multipliers 404 can be referred to as a multiplier circuit. These coefficients can be provided from memory 306 of FIG. 4 by example. In the present example embodiment, there are a total of four delay blocks 402, labeled "Delay 0" to "Delay 10", where each can include flip flop circuits or registers that latch data in response to a clock. In the present configuration, each tap includes a multiplier 404 and a tap selector 408, where the output of each multiplier 404 corresponds to the tap output. As shown in FIG. 6, the outputs of each tap are provided to an adder circuit 406, which sums the tap outputs to provide output signal Dig_Txb. In the present embodiment, signal Dig_Txa received from the first sample rate converter 300 of FIG. 4 is provided as an input to dynamic tap adjustable filter 302, and each delay block 402 is gated at 31.2 MHz that is derived from the DigRF clock, which on average results in updating the delay blocks 402 at 3.84 Ms/s. The term "gated" in the present embodiments means that the delay blocks 402 are prevented or inhibited from receiving input data as the clock is inhibited. The output Dig_Txb then represents a sum of the selected tap outputs.

In general, the configuration of fractional rate converting filter 400 is as follows. For each input sample, an upconversion factor Y is obtained by using every Yth tap index, where Y is a spacing between taps. In the present example of Y=65, the spacing between taps is 65. This sequence of selected taps between h0 and h650 is referred to as a subset of taps. The downconversion factor Z is obtained by shifting the selected subset of taps by Z to form a new subset, while maintaining the Y spacing between selected taps. The total number of taps to use is related to the upconversion factor Z and the chip footprint (CF). More specifically, the total number of taps=Z*CF, plus 1 if the product is even numbered. The selection of chip footprint for the filter depends on the desired EVM, where more chips generally results in improved EVM. Therefore, by setting Z and Y and gating the delay blocks 402 appropriately, any fractional rate conversion can be obtained. While the interface clock (ie. The DigRF interface clock is used for the final sample rate conversion, a separate clock can be generated instead.

In the present embodiment, each tap selector 408 corresponding to a different tap index is configured to receive a different set of coefficients at its input terminals. Each tap selector 408 has a range of taps that it can select, which is based on the counter configuration of tap controller 410 and the spacing of taps in each subset. As shown by the first tap selector 408 for example, it has a range of taps of h0 to h64. Tap selectors 408 can be implemented as multiplexors for example, having a different input terminal selected to be passed as its output in response to a control word from the tap controller 410. Persons skilled in the art should understand that such a control word may be a multi-bit signal, depending on the number of input terminals of the tap selector 408. Because each input terminal has a logical position, the coefficients can be arranged such that a particular subset of taps are selected for its corresponding multiplier 404 in response to one control word. For example, if one subset is h0, h65, h130, h195 and so forth until the last tap of h650, then the same logical position of each tap selector 408 is set to receive h0, h65, h130, h195 to h650. The remaining subsets of taps are arranged in the same manner. It is noted that the selectors 408 of FIG. 6 only show a portion of the total number of possible subsets. In the present embodiment, tap controller 410 is a modulo 65 counter with steps of 8 which effectively results in rate conversion of 65/8. Accordingly, each tap selector 408 provides the proper FIR coefficient under control of tap controller 410, while tap controller 410 controls synchronizes gating of the delay blocks 402. For example, delay blocks 402 are controlled to receive a new input sample at the wrap around condition, which has been previously discussed as occurring at the 9th clock cycle for the present example. It is noted that some input terminals of tap selector 408 receive a null value coefficient of 0, which means that the resulting tap output from multiplier 404 becomes a null value of 0 which does not contribute to the summed Dig_Txb output.

In the present embodiment, the sample rate upconverter corresponding to sample rate converter 300 of FIG. 4 can include the configuration of taps for different selectors 408, which are spaced apart by upconversion integer Y. The sample rate downconverter corresponding to sample rate converter 304 of FIG. 4 can include the configuration of taps for the different subsets within each selector 408, where each subset has taps shifted by integer Z relative to the previous subset of taps, and the tap controller 410. Multipliers 404 and adder 406 are used for calculating the output sample resulting from the application of the subsets of taps.

Figure 7:
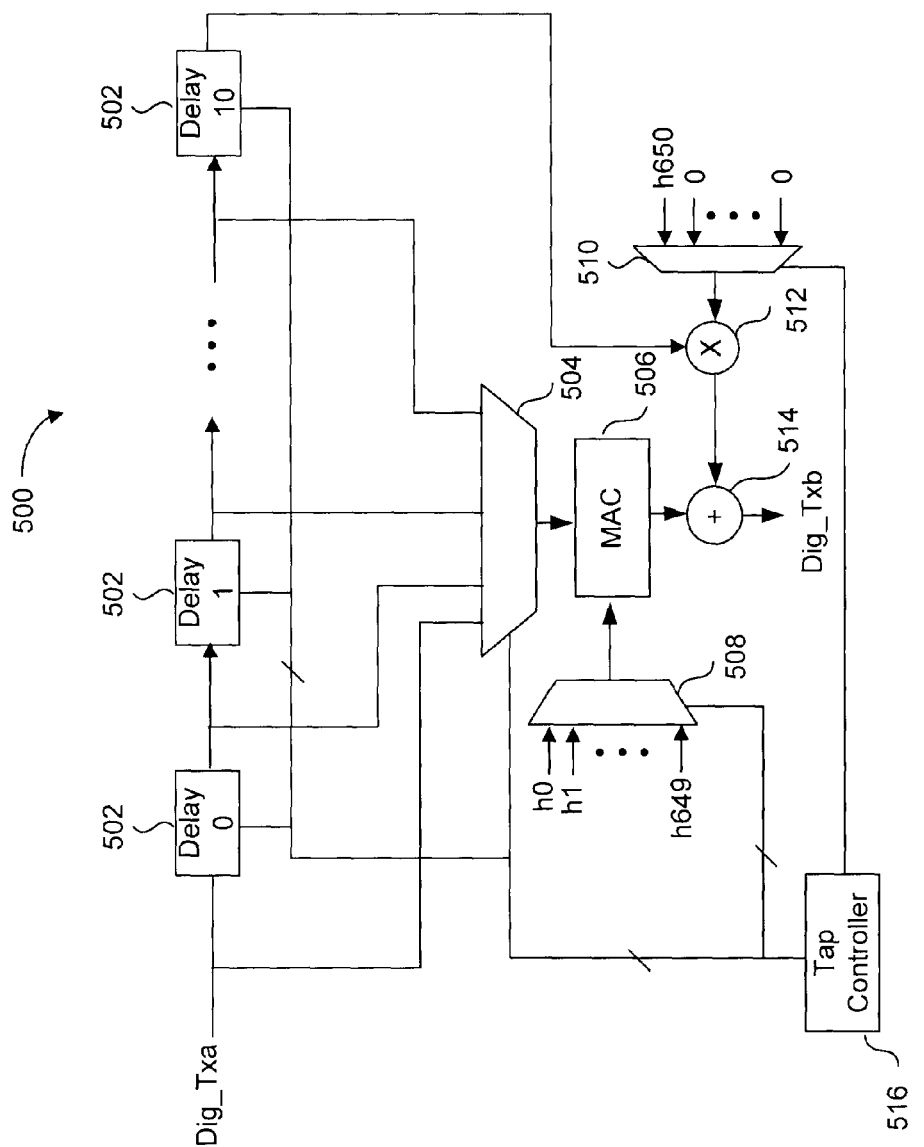
FIG. 7 is a block diagram of the fractional rate converter of FIG. 4, according to an alternate embodiment.

The embodiment of the fractional rate converter 202 of FIG. 6 is suitable for typical RFIC designs. However, as most RFIC designs progressively include higher processing power capabilities, this higher level of performance can be taken advantage of using the alternate fractional rate converting filter of FIG. 7. Fractional rate converting filter 500 of FIG. 7 is a more efficient implementation of filtering and rate conversion circuit relative to the embodiment of FIG. 6. It is more efficient as less silicon area is used by the circuits, relative to the embodiment of FIG. 6. Fractional rate converting filter 500 includes delay blocks 502 which are the same as delay blocks 402 of FIG. 6, a delay selector 504, a multiplier/accumulator (MAC) 506, a tap selectors 508 and 510, a multiplier 512, an adder 514 and a tap controller 516. The MAC 506 includes a multiplier circuit and an adder circuit, hence all the multipliers 404 of FIG. 6 are replaced by one MAC 506 clocked at 312 MHz, which is the DigRF clock in the present example. Tap selector 508 is controlled by tap controller 516 which will apply the proper FIR tap at each clock iteration. Tap selector 508 is configured to have input terminals for receiving coefficients h0 to h649. In the present embodiment, tap controller 516 is a modulo 65 counter with steps of 8 which provides sampling rate conversion of 65/8. Delay selector 504 receives the outputs from each delay block 402, and provides the proper sample at each clock iteration for MAC 506. It is noted that all the subsets of taps in the present embodiment only require the outputs of ten delay blocks 502 (ie. Delay 0 to Delay 9), except for one which requires the output of the last delay block 502 (ie. Delay 10) in the chain of delay blocks 502. For example, this subset includes taps h0, h65, . . . , h650. For this reason, the second tap selector 510 with multiplier 512 are used to include the h650 coefficient for this particular subset of taps, the output of which is summed via adder 512 to the output of MAC 506. The output sample is provided via Dig_Txb which is the output of adder 514. It is noted that elements 510, 512 and 514 are optional, depending on the tap configuration of the circuit, which depends on the desired upconversion factor.

The principle of operation of the embodiment of FIG. 7 is as follows. Tap controller 516 controls delay selector 504 to pass one output from one of the delay blocks 402 to MAC 506. At the same time, tap controller 516 controls tap selector 508 to provide the corresponding coefficient for the current subset of taps for the selected delay output from delay selector 504. Then MAC 506 internally multiplies the selected output from a delay block 402 by the selected coefficient. This continues for each of the delay block outputs 402 while MAC 506 maintains a running sum from each clock iteration. Once the sample is completed, the accumulated sum from MAC 506 is provided to adder 514. In the present embodiment, tap controller 516 rapidly cycles through a subset of taps and the corresponding outputs of delay blocks 502, before repeating the cycle with a new subset of taps. It is noted that adder 514 is used to add the output of multiplier 512 only for a particular subset of taps, namely the one that includes tap h650. The principle of applying subsets of taps with tap spacings Y, with different subsets shifted by Z is used in the present embodiment.

In summary, through dynamic tap adjustment of filter EVM can be minimized, thereby providing more margin for EVM contribution from other parts of the wireless device.

The presently described embodiments can be used for voice communication and data communication applications. It has been noted that the peak-to-average ratio (PAR) of the signal increases after pulse shaping by FIR filter 302. Depending on the application, a maximum PAR may be imposed on the output signal (such as Dig_Txc of FIG. 4). For a 3G voice channel by example, the PAR at the input of first sample rate converter 300 of FIG. 4 is 0 dB and the PAR at the output of the second sample rate converter 304 is 3.34 dB. For an HSUPA data channel by example, the PAR at the input of first sample rate converter 300 of FIG. 4 is 3.86 dB and the PAR at the output of the second sample rate converter 304 is 5.86 dB. This is because a voice and data channel includes signals, which are weighted differently. Accordingly, knowing what the increase in the PAR is, a variable gain circuit located before first sample rate converter 300 can be adjusted to attain a desired peak and average (RMS), in order to maintain the same ratio of peak-to-average RMS. More specifically, this gain can be adjusted to make the peak of the signal the same for all different types of inputs, which is desirable for analog/RF circuits. However, a constant peak may not be desirable for a transmit gain control loop. Therefore in this case, the gain is adjusted to have a fixed RMS (average) and variable peak. For example, in the voice channel example, the variable gain circuit can have its gain adjusted by −3.34 dB if a constant peak-to-average RMS is desired. Alternately, the gain can be decreased further, or increased to meet a target output peak-to-average RMS.

The embodiments of the present invention have been described with respect to the transmit path circuits. The presently described embodiments are equally applicable to receive path circuits. For example, the schematic of FIG. 4 can be reconfigured for receive path circuits such that a signal from the antenna is received as Dig_Txc and downsampled by sample rate converter 304, filtered, and then upsampled by sample rate converter 300. In such receive path configuration, the fractional rate converting filter 400 is reconfigured to operate in the opposite direction (receive direction) and the delay blocks are clocked at 3.84 MHz. In such an alternate application, the delay blocks of FIGS. 6 and 7 would be clocked on average at output speed, which in the presently described example is 3.84 MHz. Input samples are clocked at 31.2 MHz and are stored in a memory as they arrive. In otherwords, the memory is clocked at 31.2 MHz. The tap controller of FIGS. 6 and 7 is configured to change the address of the memory location used for filter calculation in the receive application, and will run on average speed of 3.84 MHz, with the memory being used as a circular buffer. It is noted however that for the present DigRF implementation example, data should be sent to the base band processor at 7.68 Ms/s or 15.36 Ms/s, which will change the sample rate conversion from 8/65 to 16/65 or 32/65. Therefore, the tap controller is reconfigured to achieve either the 16/65 or 32/65 fractional conversion rates.

One of the significant advantages provided by the embodiments of the present invention is that only the clock multiplier of the interface is required for the sample rate conversion. In otherwords, no additional clock multiplier PLL is required, which conserves silicon area and power consumption. Furthermore, the omission of the additional PLL eliminates spurious noise which can be generated by PLL circuits.

The embodiments of the present invention are not limited to application to the DigRF standard, but are applicable to any custom standard or industry established standard.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A fractional rate converting filter in a transmitter comprising: a delay line for receiving from a baseband interface a digital input signal at a first sample rate, the delay line having delay blocks each providing an output, the delay line receiving samples gated at a plurality of clock cycles of an integer sub-multiple frequency of a clock provided by the interface that provides the digital input signal; a multiplier circuit configured to operate at each of the plurality of clock cycles for each input sample for receiving the output of each delay block and multiplying the outputs by corresponding filter tap coefficients, each filter tap coefficient being spaced by a first integer Y, the integer Y corresponding to an upconversion factor, the multiplier circuit providing tap outputs corresponding to each of the outputs and wherein the multiplier circuit is embodied as hardware, as a series of operating instructions configured to direct operation of a processor, or as a combination thereof; an adder circuit for receiving and summing the tap outputs to provide an output signal; and, a selector for iteratively shifting the filter tap coefficients corresponding to each output by a second integer Z in each clock cycle for the plurality of clock cycles at the integer sub-multiple frequency of the clock, wherein, the multiplier circuit is configured to multiply the output of each delay block by corresponding shifted filter tap coefficients in each clock cycle and the delay blocks are inhibited from receiving another input sample during the plurality of clock cycles, the integer Z corresponding to a downconversion factor, the output signal having a second sample rate at the integer sub-multiple frequency of the clock equivalent to the first sample rate multiplied by Y and divided by Z.

2. The fractional rate converting filter of claim 1, wherein the multiplier circuit includes individual multipliers each configured to receive one of the respective outputs.

3. The fractional rate converting filter of claim 2, wherein the selector includes multiplexor circuits receiving different subsets of filter tap coefficients for application to each of the individual multipliers at the same time, each of the subsets having the filter tap coefficients spaced by the first integer Y, and each of the different subsets having the filter tap coefficients shifted by the second integer Z relative to a previous subset of the filter tap coefficients.

4. The fractional rate converting filter of claim 3, further including a tap controller for controlling each of the multiplexor circuits to provide one of the different subsets during one of predetermined number of clock cycles.

5. The fractional rate converting filter of claim 1, wherein the multiplier circuit and the adder circuit are part of a multiplier/accumulator (MAC).

6. The fractional rate converting filter of claim 5, wherein the selector includes a tap selector configured to receive all the filter tap coefficients and to provide a subset of the filter tap coefficients in one clock cycle, and a delay selector configured to receive the outputs and to provide the outputs in the one clock cycle synchronously with the filter tap coefficients of the subset, each of the filter tap coefficients being spaced by the first integer Y.

7. The fractional rate converting filter of claim 6, further including a tap controller for controlling the tap selector to output different subsets of filter tap coefficients, where each subset has the filter tap coefficients shifted by the integer Z relative to a previous subset.

8. The fractional rate converting filter of claim 1, wherein the selector is operable to provide different subsets of filter tap coefficients for a new input sample, wherein a new input sample is received each time the filter tap coefficients wrap around.

9. A method for fractionally converting a first sample rate to a second sample rate, comprising: receiving input samples of a digital input signal in a delay line having outputs, and multiplying a subset of filter tap coefficients with the outputs, the filter tap coefficients being spaced apart by Y, to generate an upsampled digital input signal having undesired images; filtering out the undesired images from the upsampled digital input signal to provide a filtered upsampled digital input signal, by controlling an FIR filter to provide sample outputs of the upsampled signal using different subsets of taps for each cycle of a signal at an integer sub-multiple frequency of a clock provided by an interface that provides the digital signal;

downsampling the filtered upsampled digital input signal by an integer factor of Z to generate a final digital input signal having the second sample rate, wherein downsampling includes multiplying the outputs with different subsets of filter tap coefficients, each of the subsets having filter tap coefficients shifted by Z relative to a previous subset of filter tap coefficients, and providing each of the subsets in each clock cycle of a plurality of clock cycles at the integer sub-multiple-frequency of the clock, wherein the delay line includes delay blocks each providing one of the outputs, the delay blocks being inhibited from receiving another input sample during the plurality of clock cycles and enabled to receive a new sample after the plurality of clock cycles, wherein the multiplying is embodied as hardware, as a series of operating instructions configured to direct operation of a processor, or as a combination thereof.

10. A method according to claim 9, wherein the selector is operable to provide different subsets of filter tap coefficients for a new input sample, wherein a new input sample is received each time the filter tap coefficients wrap around.

* * * * *